US011211550B2

United States Patent
Liu et al.

(10) Patent No.: US 11,211,550 B2
(45) Date of Patent: Dec. 28, 2021

(54) MAGNETIC MEMORY DEVICES WITH MAGNETIC FIELD SENSING AND SHIELDING

(71) Applicant: GLOBALFOUNDRIES Singapore Pte. Ltd., Singapore (SG)

(72) Inventors: Bin Liu, Singapore (SG); Eng Huat Toh, Singapore (SG); Samarth Agarwal, Singapore (SG); Ruchil Kumar Jain, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/939,105

(22) Filed: Jul. 27, 2020

(65) Prior Publication Data

US 2020/0357980 A1    Nov. 12, 2020

Related U.S. Application Data

(63) Continuation of application No. 16/225,005, filed on Dec. 19, 2018, now Pat. No. 10,777,734.

(51) Int. Cl.
*G11C 11/00* (2006.01)
*H01L 43/02* (2006.01)
(Continued)

(52) U.S. Cl.
CPC .......... *H01L 43/02* (2013.01); *G11C 11/1675* (2013.01); *G11C 11/1695* (2013.01); *H01L 27/222* (2013.01); *H01L 43/12* (2013.01)

(58) Field of Classification Search
CPC .. G11C 11/1675; G11C 11/1695; H01L 43/02
(Continued)

(56) References Cited

U.S. PATENT DOCUMENTS 8,045,726 B2    10/2011  Kimura
2007/0165450 A1   7/2007  Boeve
(Continued)

FOREIGN PATENT DOCUMENTS

TW       200539190 A    12/2005

OTHER PUBLICATIONS

Chia-Yu Wang et al., "Impact of external magnetic field on embedded perpendicular STT-MRAM technology qualified for solder reflow", IEDM17, 2017, pp. 21.1.1-21.1.4, IEEE.
(Continued)

*Primary Examiner* — Vu A Le
(74) *Attorney, Agent, or Firm* — Viering Jentschura & Partner MBB

(57) ABSTRACT

In a non-limiting embodiment, a magnetic memory device includes a memory component having a plurality of magnetic storage elements for storing memory data, and one or more sensor components configured to detect a magnetic field external to the memory component. The sensor component outputs a signal to one or more components of the magnetic memory device based on the detected magnetic field. The memory component is configured to be terminated when the signal is above a predetermined threshold value. In some embodiments, a magnetic field is generated in a direction opposite to the direction of the detected external magnetic field when the signal is above the predetermined threshold value.

20 Claims, 9 Drawing Sheets

(51) Int. Cl.
    *H01L 27/22*   (2006.01)
    *G11C 11/16*   (2006.01)
    *H01L 43/12*   (2006.01)

(58) Field of Classification Search
    USPC ........................................................ 365/158
    See application file for complete search history.

(56) References Cited

U.S. PATENT DOCUMENTS

| | | |
|---|---|---|
| 2007/0171695 A1* | 7/2007 | Aouba ................... G11C 11/155 |
| | | 365/145 |
| 2009/0122597 A1 | 5/2009 | Sugibayashi et al. |
| 2009/0146231 A1* | 6/2009 | Kuper ..................... G11C 11/18 |
| | | 257/421 |
| 2011/0164448 A1 | 7/2011 | Sato et al. |
| 2014/0203341 A1 | 7/2014 | Guo |

OTHER PUBLICATIONS

Ravi Patel et al., "Reducing Switching Latency and Energy in STT-MRAM Caches With Field-Assisted Writing", IEEE Transactions on very Large Scale Integration (VLSI) Systems, Jan. 2016, pp. 129-138, vol. 24, No. 1, IEEE.

* cited by examiner

MAGNETIC MEMORY DEVICES WITH MAGNETIC FIELD SENSING AND SHIELDING

CROSS-REFERENCE TO RELATED APPLICATION

The present application is a continuation application of U.S. application Ser. No. 16/225,005, filed on Dec. 19, 2018, which is incorporated herein by reference in its entirety and for all purposes.

TECHNICAL FIELD

The present disclosure relates generally to magnetic memory devices with magnetic field sensing and shielding.

BACKGROUND

External magnetic fields present in the operating environment of memory devices such as magnetic random access memory (MRAM) devices or in the event of a sabotage or a hacking attempt may cause significant errors in the operation of the MRAM devices. In some cases, the presence of the external magnetic fields may lead to failure of the memory device in performing its intended operation. Therefore, an external magnetic field poses significant risks to the reliability and in some cases to the security of the MRAM devices. Some of the efforts to improve immunity of MRAM devices to external magnetic fields include film stack improvements and packaging shield(s). However, such techniques to improve immunity of MRAM devices to external magnetic fields incur high research and development costs and the achievable immunity would be limited due to the nature of the film characteristics and materials used for the packaging shield.

Accordingly, it is desirable to provide memory devices which are reliable and with enhanced security, particularly for operating in environments susceptible to or with high external magnetic fields.

SUMMARY

Embodiments generally relate to semiconductor devices and methods for forming the semiconductor devices. More particularly, embodiments relate to magnetic memory devices which include a memory component having a plurality of magnetic storage elements for storing memory data, and one or more sensor components configured to detect a magnetic field external to the memory component. The sensor component(s) outputs a signal to one or more components of the magnetic memory device based on the detected magnetic field. In one non-limiting embodiment, the memory component is configured to be terminated when the signal is above the predetermined threshold value. In an alternative non-limiting embodiment, a magnetic field is generated in a direction opposite to the direction of the detected external magnetic field when the signal is above the predetermined threshold value in addition to or in lieu of terminating the memory component when the signal is above the predetermined threshold value.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1A:
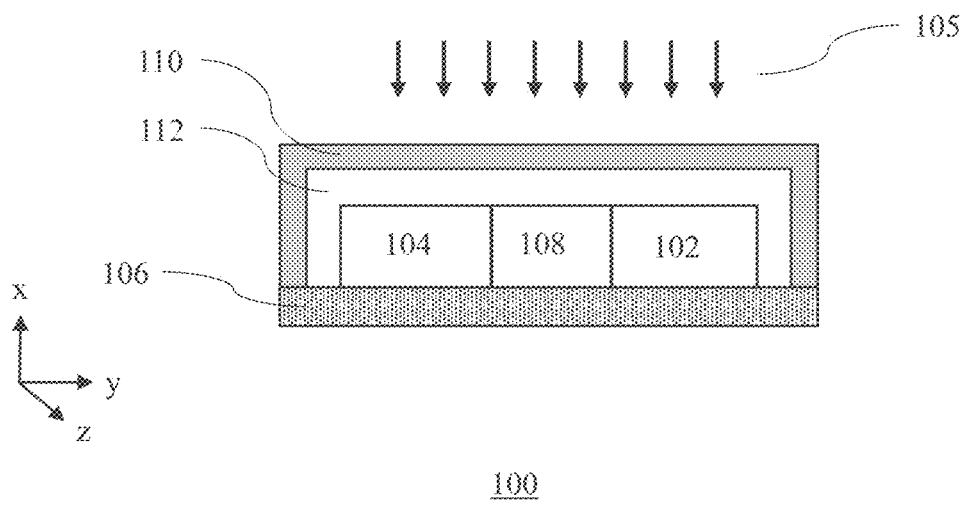
FIGS. 1A-1B show exemplary cross-sectional and top views of an embodiment of a memory device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified.

In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments generally relate to semiconductor devices and methods for forming the semiconductor devices. More particularly, some embodiments relate to memory devices which includes a memory component having magnetic storage elements for storing memory data, and one or more sensor components configured to detect a magnetic field external to the memory component. The sensor component(s) may output a signal to one or more components of the memory device based on the detected magnetic field. In one non-limiting embodiment, the memory device includes a safety device that terminates the memory component based on the signal from the sensor component(s). In another non-limiting embodiment, the memory device includes one or more coils that generates a magnetic field in a direction opposite to a direction of the detected external magnetic field. The generated magnetic field advantageously reduces or eliminates an impact to the memory component of the detected external magnetic field. This improves immunity of the memory devices to external magnetic fields, enabling memory devices to have better reliability and security. These and other exemplary features and advantages will be more apparent in the following description.

Embodiments provide memory devices which may operate in an extreme electro-magnetic environment or where sabotage/hacking may be anticipated, while maintaining reliability of the devices. The memory devices, for example, may be incorporated into standalone memory devices including, but not limited to, Universal Serial Bus (USB) or other types of portable storage units, or ICs, such as microcontrollers or system on chips (SoCs). For example, the devices or ICs may be incorporated into or used with consumer electronic products, automotive, space, military, data/finance security applications where power and space are not a major concern.

Figure 1B:
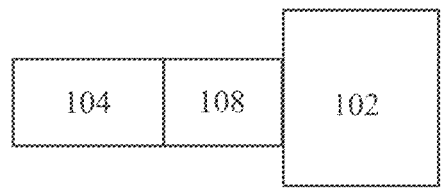

FIGS. 1A-1B show cross-sectional and top views of a non-limiting embodiment of a device 100. The device 100 may be a memory device. In one embodiment, the memory device includes a memory component 102 and a sensor component 104. The memory component 102 may be a semiconductor die or chip having a plurality of magnetic storage (or magnetoresistive) elements for storing memory data. In other words, the memory device 100 may be a magnetic memory device which stores data using the magnetic storage elements. The magnetic storage elements, for example, use a magnetic field based switching technology or magnetic polarization for storing data. The memory component 102 may be, or include, a magnetic random access memory (MRAM) device such as a spin-transfer torque magnetic random access memory (STT-MRAM) device in a non-limiting example. The memory component, for example, may be any MRAM devices ranging from a 40 nm down to a 7/5 nm technology node. In the case the memory component includes more than one die, the dies may be arranged in a planar arrangement, a vertical arrangement, or a combination thereof.

The magnetic storage elements may be formed of magnetic materials. For example, the magnetic storage elements may be magnetic tunnel junction (MTJ) elements or MTJ stacks which include a magnetically fixed (pinned) layer, one or more tunneling barrier layers, and a magnetically free layer. For example, the fixed layer may include a magnetic layer and a pinning layer. The pinning layer, for example, pins the magnetization direction of the magnetic layer, forming a pinned layer. The MTJ elements may be a bottom-pinned MTJ element or a top-pinned MTJ element. For example, the bottom-pinned MTJ element may be formed by having the magnetically fixed layer disposed below the magnetically free layer while the top pinned MTJ element may be formed by having the fixed layer disposed above the free layer. The free layer and the fixed layer may be composite-based, such as including but not limited to a CoFeB or a CoFe material, and the tunneling barrier layer may be or include an oxide material, but is not limited to, MgO, $Al_2O_3$, or a combination thereof. As for the pinning layer, the material may be formed of, but is not limited to a manganese based material, such as PtMn, IrMn, or a combination thereof. Other materials for forming the MTJ elements may also be useful. Providing other suitable types of magnetic storage elements for the memory component may also be useful.

The memory component may be provided over or on a substrate 106. The substrate, for example, may be a semiconductor substrate, such as a silicon substrate in a non-limiting example. Providing any other suitable semiconductor materials may also be useful. In another example, the substrate may include a printed circuit board (PCB) substrate. In yet another example, the substrate may include a polymer-based substrate, such as a polyimide substrate. The substrate may include a die attach or mounting region for mounting one or more dies and electrical connections to the dies and to external components. Other types of substrates may also be useful.

The sensor component 104 may be configured to detect a magnetic field 105 external to the memory component 102 (or the memory device 100). The sensor component 104 may output a signal to one or more components of the memory device 100 based on the detected magnetic field. In some embodiments, the sensor component 104 may be configured to continuously output signal to one or more components of the memory device 100. The output signal may be a voltage ($V_{magnetic}$) in a non-limiting example. The output voltage may depend on the magnetic flux density (B) of the detected external magnetic field. In one non-limiting embodiment, the memory component may be configured to be terminated when the output signal from the sensor component 104 is above a predetermined threshold value. The threshold value may be determined by the operating environment and electrical characteristics of the memory component 102. For example, the sensor component 104 may output a signal above the predetermined threshold value in the presence of a hostile external magnetic field having a high magnetic flux density. For example, a high magnetic flux density may range from about 500 Oe and above in a non-limiting embodiment.

The sensor component 104 can be, or include, any type of magnetic sensors, including a Hall sensor, tunnel-magnetoresistance (TMR) sensor, anisotropic magnetoresistance (AMR sensor), and giant magnetoresistance (GMR) sensor, etc. For example, the sensor component 104 may be a semiconductor die or chip having a magnetic sensing element, such as a hall plate, or a TMR sensor. In a non-limiting example, the sensor component 104 may be configured to sense an external magnetic field 105 in a first direction. The first direction, for example, may be along the x-axis. For example, the first direction may be perpendicular to a horizontal top surface of the memory component 102 (or memory device 100). For example, the sensor component 104 may be a one-dimensional (1D) magnetic sensor. The 1D magnetic sensor may sense the external magnetic field 105 in a first dimension, such as along x-axis, in a non-limiting example. Providing sensor components with additional sensing dimensions may also be useful. For example, the sensor component may be a two-dimensional or a three-dimensional magnetic sensor which may sense magnetic fields along the y-axis and/or z-axis.

The sensor component 104 may provide the output signal to a safety device 108 of the memory device 100. The safety device 108 may terminate the memory component 102 based on the signal from the sensor component 104. The safety device may be configured to terminate the memory component when the output signal from the sensor component is above the predetermined threshold value. The output signal may be above the predetermined threshold value in the presence of a hostile external magnetic field.

In one non-limiting embodiment, the safety device 108 may be a fuse. For example, the fuse may be a sacrificial device which includes a metal wire or strip that melts when too much current flows through it, thereby interrupting current flow to the memory component 102 and operation thereof. The fuse may be arranged in series to the memory component 102. The fuse may be triggered by the output signal from the sensor component 104. For example, the output voltage from the sensor component produces a high current flow through the fuse which triggers the fuse to melt. This interrupts the electrical operation of the memory component 102 in the memory device 100, thereby terminating the memory component 102. The fuse may have specific current and voltage ratings, breaking capacity and response times, depending on the desired requirement for terminating the memory component 102. Other types of safety devices for terminating the memory component 102 may also be useful.

In an alternative non-limiting example, the sensor component 104 may be configured to output a signal back to the memory component 102 to directly terminate the memory component 102 in addition to or in the absence of the safety device 108. For example, the memory component 102 receives the output signal from the sensor component 104 and would then either be 'killed' (i.e. no longer functional) or switched 'off' based on the output signal received from the sensor component 104. The sensor component 104 and the safety device 108 enhance security of the memory component 102, for example, in the event of a sabotage or hacking attempt.

The sensor component 104 and the safety device 108 may be arranged or formed over the substrate 106. For example, the memory component 102, the sensor component 104, and the optional safety device 108 may be arranged on the same chip (e.g., system on a chip), as shown in FIG. 1A. The memory component 102, the sensor component 104, and the safety device 108 may have a planar arrangement. As illustrated, the safety device 108 may be arranged between the sensor component 104 and the memory component 102. Other configurations may also be useful. For example, the memory component 102, the sensor component 104, and the safety device 108 may be arranged by chip stacking. For example, the safety device 108 may be arranged over a top surface of the memory component 102, while the sensor component 104 may be arranged adjacent to a sidewall of the memory component 102.

In a non-limiting embodiment, the memory device 100 includes a capping member 110. The capping member 110 encapsulates the memory component 102, the sensor component 104 and the safety device 108. The capping member 110 may serve as packaging of the memory component 102 of the memory device 100. The capping member 110 may be attached to the substrate 106, for example, using an adhesive, solder paste, etc (not shown). An optional cavity may be arranged between the capping member 110 and the substrate 106 to accommodate the memory component 102, the sensor component 104 and the safety device 108. In other embodiments, an encapsulant or fill material, such as epoxy in a non-limiting embodiment, may be arranged between the capping member 110 and the memory component 102, the sensor component 104 and/or the safety device 108 (not shown). The capping member may be, or include, any material suitable for magnetic shielding.

Figure 2A:
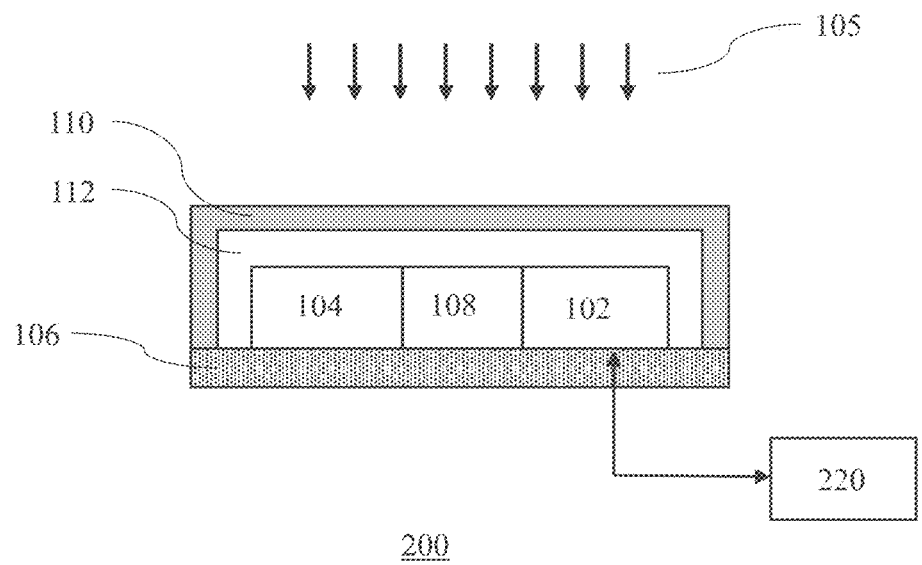
FIGS. 2A-2B show exemplary cross-sectional and top views of another embodiment of a memory device.
Figure 3A:
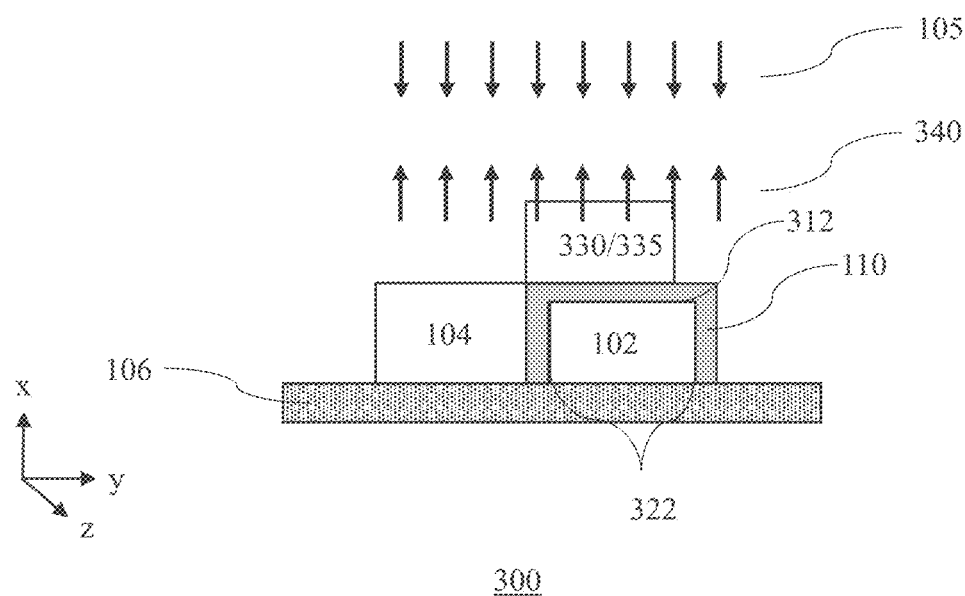
FIGS. 3A-3D show exemplary cross-sectional and schematic views of another embodiment of a memory device.
Figure 6A:
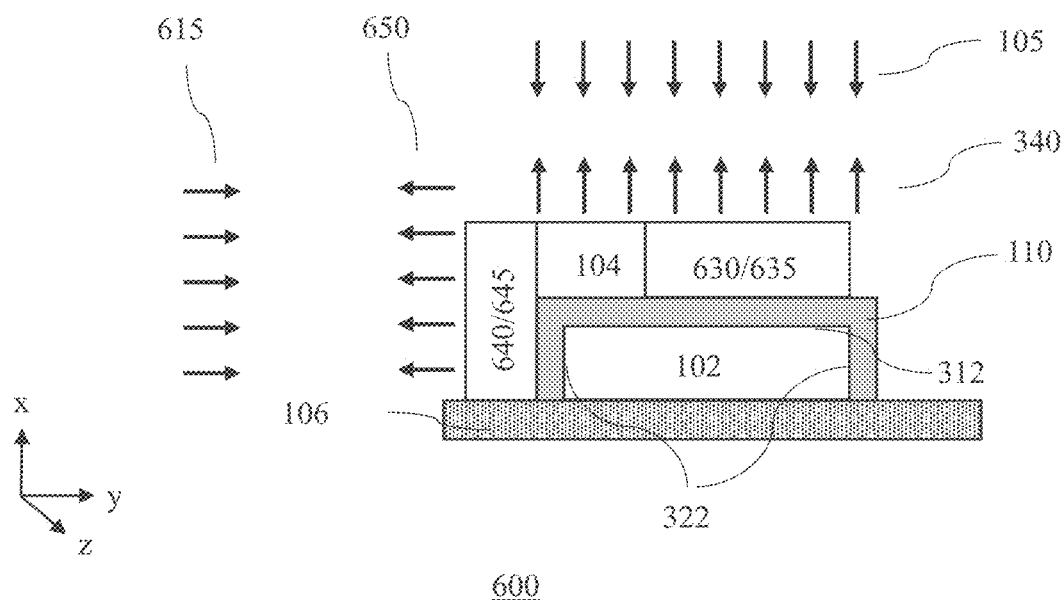
FIG. 6A shows an exemplary cross-sectional view of yet another embodiment of a memory device.

In addition, while only one sensor component 104 is depicted throughout the figures, two or more sensor components may be used as contemplated by the inventors. For example, a non-limiting example of a sensor component 104 depicted in one figure may be combined with another sensor component 104 in another figure, and such embodiments are envisaged by the inventors within the present Application. For example, a first sensor may be arranged within a capping member as depicted in FIG. 2A, and an optional second sensor may be arranged laterally adjacent to but outside the capping member as depicted in FIG. 3A. An optional third sensor may be arranged over the capping member as depicted in FIG. 6A.

In such an arrangement having multiple sensor components, each individual sensor component may output a collective signal to one or more components of the memory device in a non-limiting embodiment. The predetermined or predefined threshold value may be a collective measurement from two or more sensor components. Alternatively, each individual sensor component may output its own individual output signal to one or more components of the memory device to where an output signal from a first sensor component is additive with another output signal from a different sensor component. Said differently, the output signal may be sent from the one or more sensors as a collective output signal, or the output signals may be individually sent from the one or more sensors to be additive when received by the one or more components of the memory device.

Figure 2B:
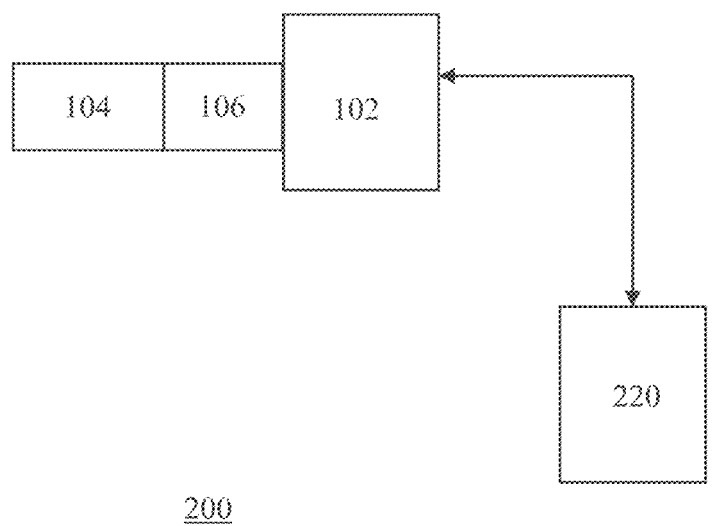

FIGS. 2A-2B show exemplary cross-sectional and top views of another embodiment of a memory device 200. The device 200 is similar to that described in FIGS. 1A-1B. For example, the memory device 200 includes a memory component 102, a sensor component 104, and a safety device 108. The memory component 102 and the sensor component 104 may be arranged over a substrate 106. In the interest of brevity, common elements or elements having the same reference numerals may not be described or described in detail.

In one embodiment, the memory device 200 may be coupled to an external memory device 220. The external memory device 220 may serve as a back-up to store data of the memory component 102 prior to the memory component 102 being terminated by the safety device 104. The sensor component 104 may output a signal to the memory component 102 and the safety device 108. The memory component 102 of the memory device may be configured to transfer memory data to the external memory device 220 based on the signal from the sensor component 104. For example, the memory component 102 may transfer data to the external memory device 220 when the output signal from the sensor component is above a predetermined threshold value. The transfer of the memory data occurs prior to termination of the memory component 102. The optional safety device 104 may be chosen based on desired characteristics such that it is activated and terminates the memory component 102 after the transfer of data by the memory component 102 has completed. In a non-limiting example, the output signal may be provided simultaneously to the memory component 102 and safety device 108. The safety device may be chosen such that it terminates or kills the memory component 102 after a period of time which is sufficient for the safe and complete transfer of data.

The external memory device 220 may be any form of non-transitory computer-readable media, including, but not limited to, dynamic random access memory (DRAM), static random access memory (SRAM), Erasable Programmable Read-Only Memory (EPROM), Electrically Erasable Programmable Read-Only Memory (EEPROM), flash memory devices, magnetic disks, removable disks, magneto-optical disks, any other volatile or non-volatile memory, or a combination thereof. The data communication between the external memory device 220 and the memory component 102 can be wired or wireless.

FIGS. 3A-3D show cross-sectional and schematic views of another embodiment of a memory device 300. The device 300 is similar to that described in FIGS. 1A-1B. For example, the memory device 300 includes a memory component 102 and a sensor component 104. The memory component 102 and the sensor component 104 may be arranged over a substrate 106. In the interest of brevity, common elements or elements having the same reference numerals may not be described or described in detail.

In one embodiment, the capping member 110 encapsulates the memory component 102. As illustrated in FIG. 3A, the capping member 110 covers a top surface 312 and sidewalls 322 of the memory component 102. The capping member 110 may serve as a packaging of the memory component 102 of the memory device 300. The capping member may be, or include, any material suitable for magnetic shielding.

The sensor component 104 may be arranged adjacent to and outside of the capping member 110. As illustrated in FIG. 3A, the sensor component 104 may be arranged over a sidewall portion of the capping member 110 in a non-limiting embodiment. Other arrangements of the sensor component 104 may also be useful. The sensor component 104, in one embodiment, may be a one-dimensional (1D) magnetic sensor. The 1D magnetic sensor may sense the external magnetic field 105 in one direction, such as a vertical direction relative to a top surface of the memory component 102. For example, the 1D magnetic sensor may sense the external magnetic field 105 in a first dimension, such as along x-axis. Providing sensor components with additional sensing dimensions may also be useful. For example, the sensor component may be a two-dimensional or a three-dimensional magnetic sensor which may sense magnetic fields along the x/y-axis and/or z-axis.

The sensor component 104, in one embodiment, may be a two-dimensional (2D) magnetic sensor or a three-dimensional (3D) magnetic sensor. The 2D magnetic sensor may sense the external magnetic field in two dimensions, while the 3D magnetic sensor may sense the external magnetic field in three dimensions. For example, a first dimension may be along the x-axis, a second dimension may be along the y-axis, and a third dimension may be along the z-axis. As an example, the first dimension may be in a vertical direction relative to a top surface of the memory component 102 (e.g., x-axis), the second dimension and the third dimension may be in a horizontal direction relative to the top surface of the memory component 102 (e.g., y-axis and z-axis). The first, second, and third dimensions may be perpendicular to each other.

In one non-limiting embodiment, the memory device 300 includes a coil 330 and a voltage controller 335 of the coil. The voltage controller 335 may serve to control current flow in the coil 330. The coil 330 may be configured to generate a magnetic field 340 in a direction opposite to the direction of the detected external magnetic field 105. The generated magnetic field 340 reduces or eliminates an impact to the memory component 120 of the detected external magnetic field 105 and provides a shielding effect to the memory component 102 from the external magnetic field.

For example, the detected external magnetic field 105 may be in a first direction while the generated magnetic field 340 is in a second direction opposite to the first direction. The first direction may be towards a top surface 312 of the memory component 102, while the second direction may be outwards from, i.e. away from, the top surface 312 of the memory component, as illustrated in FIG. 3A. In other cases, the first direction of the detected external magnetic field 105 may be away from a top surface 312 of the memory component 102, while the second direction of the generated magnetic field 340 may be towards the top surface 312 of the memory component, as illustrated in FIG. 3C.

The coil 330 and voltage controller 335 may be arranged over a top surface of the memory component 102. As shown in FIG. 3A, the coil 330 is formed over the capping member 110. The coil 330 and the memory component 102 may have a vertical arrangement over the substrate 106 in a stacked configuration. The coil 330 may be arranged above or around the memory component 102. Other configurations may also be useful. For example, the coil 330 and the memory component 102 may have a planar arrangement over the substrate, such as the coil 330 being arranged adjacent to a sidewall portion of the capping member 110 which encapsulates the memory component. Providing the sensor component 104 and coil 330 outside the capping member 110 of the memory component 102 enables less influence from the coil 330 to the circuitry of the memory component 102. The coil may be formed of back-end-of-line (BEOL) metal lines in BEOL processing or external metal wires. The coil, for example, may be formed of a conductive material, such as copper (Cu) or a copper-based material in a non-limiting example. Providing a 1D magnetic sensor and a single electric coil with the memory component 102 enables the memory device to operate in an environment with mainly one-directional external magnetic field.

Figure 3B:
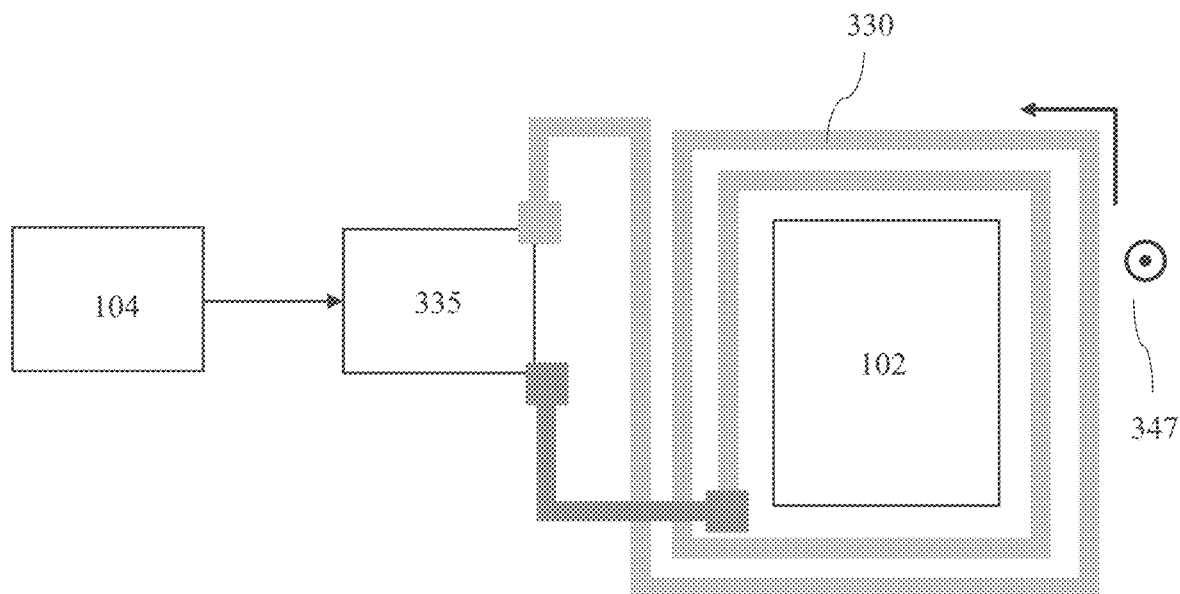
Figure 3C:
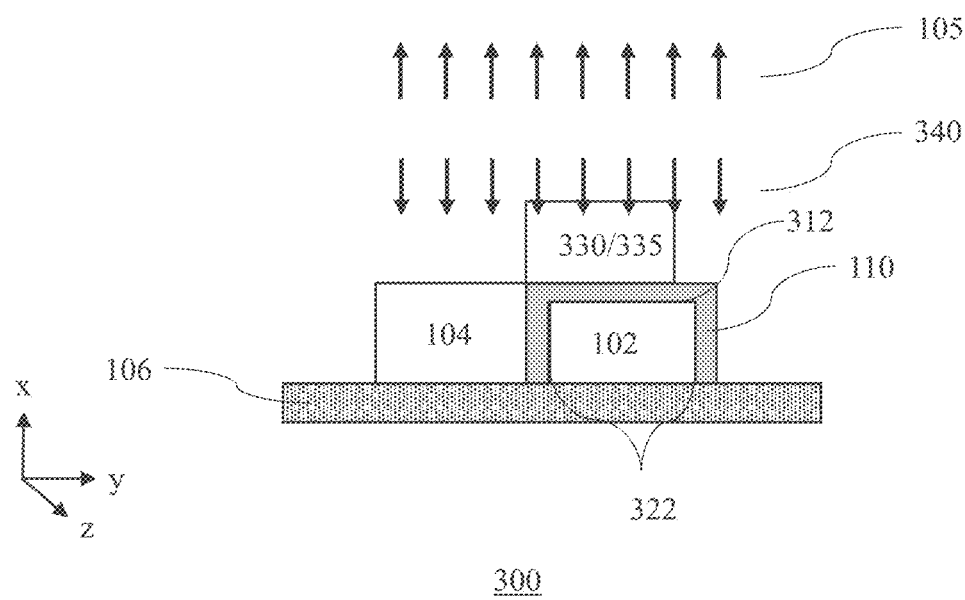
Figure 3D:
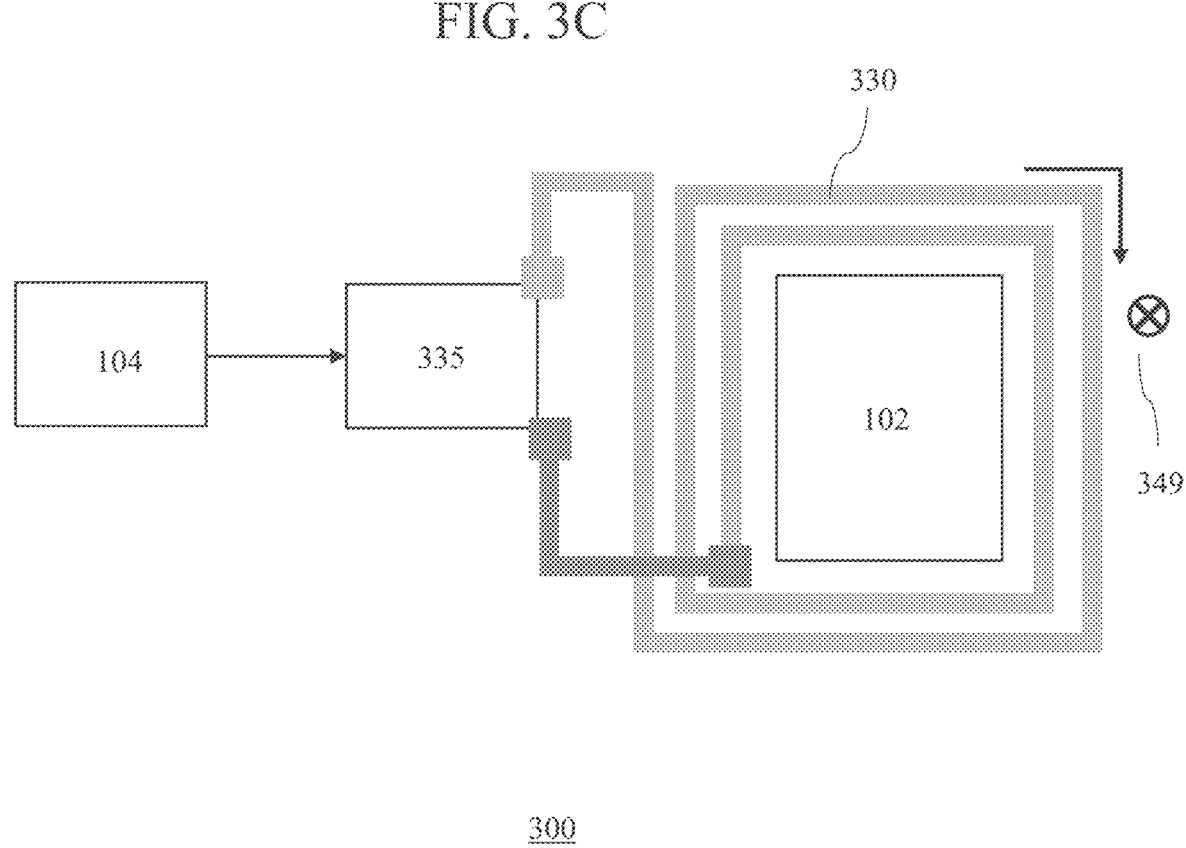

FIG. 3B and FIG. 3D show exemplary schematic views of the operation of memory device 300. The coil 330 may have N number of turns. The coil 330 is illustrated to be around the memory component 102, however, it is understood that the coil 330 may have other configurations over the memory component 102. The sensor component 104 may continuously output signal such as a voltage to the coil 330 (e.g., via voltage controller 335). Upon receiving an output signal from the sensor component 104 that exceeds a predetermined threshold value, the coil 330 generates the magnetic field 340 in the opposite direction to the detected external magnetic field.

As illustrated, the sensor component 104 provides the output signal to the voltage controller 335. The voltage controller 335 controls the generation of current flow in the coil 330. The coil 330 further generates the magnetic field 340 in a direction opposite the detected external magnetic field 105. For example, the current flow in the coil 330 may be in an anti-clockwise direction. The generated magnetic field may be in a direction outwards 347 from the top surface of the memory component 102 in the case where the external magnetic field 105 is towards the top surface of the memory component 102, as illustrated in FIG. 3B. The generated magnetic field may be in a direction towards 349 the top surface of the memory component 102 in the case where the external magnetic field 105 is away from the top surface of the memory component 102, as illustrated in FIG. 3D. For example, the current flow in the coil 330 may be in a clockwise direction.

The generated electric field may be increased by increasing the current flow or number of turns of the coil in the case of a fixed current coil.

Figure 4A:
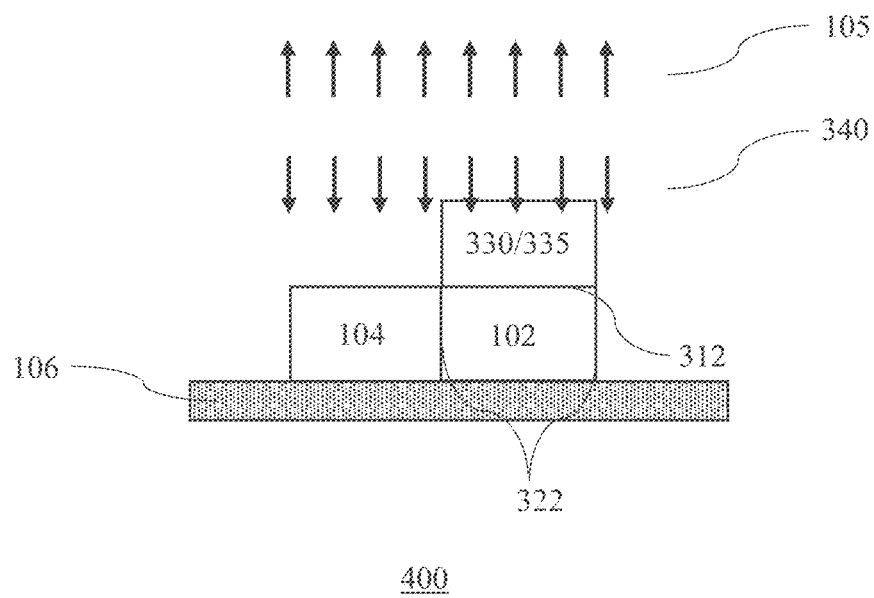
FIGS. 4A-4B show exemplary cross-sectional and schematic views of another embodiment of a memory device.
Figure 4B:
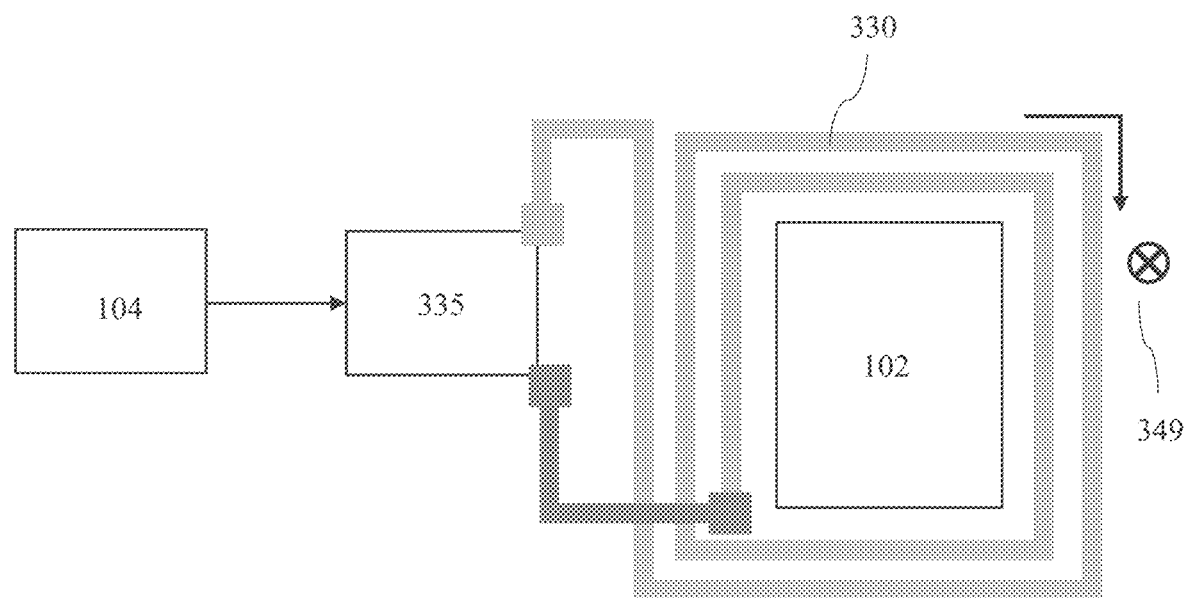

FIGS. 4A-4B show non-limiting cross-sectional and schematic views of another embodiment of a memory device 400. The device 400 is similar to that described in FIGS. 3A-3D. For example, the memory device 400 includes a memory component 102, a sensor component 104, a coil 330, and a voltage controller 335. In the interest of brevity, common elements or elements having the same reference numerals may not be described or described in detail.

As illustrated in FIG. 4A, the memory device 400 may be provided without a capping member (or packaging) over the memory component 102. In one embodiment, the coil 330 and voltage controller 335 may be arranged over the top surface 312 of the memory component 102. For example, the coil 330 and voltage controller 335 may be formed directly on the memory component 102 in BEOL processing. FIG. 4B shows exemplary schematic view of the operation of memory device 400. Similar to the operation of the memory device 300 as described in FIG. 3B and FIG. 3D, the coil 330 is configured to generate a magnetic field in a direction opposite the detected external magnetic field. The generated magnetic field may be in a direction towards 349 the top surface of the memory component 102 in the case where the external magnetic field is away from the top surface of the memory component 102.

Figure 5A:
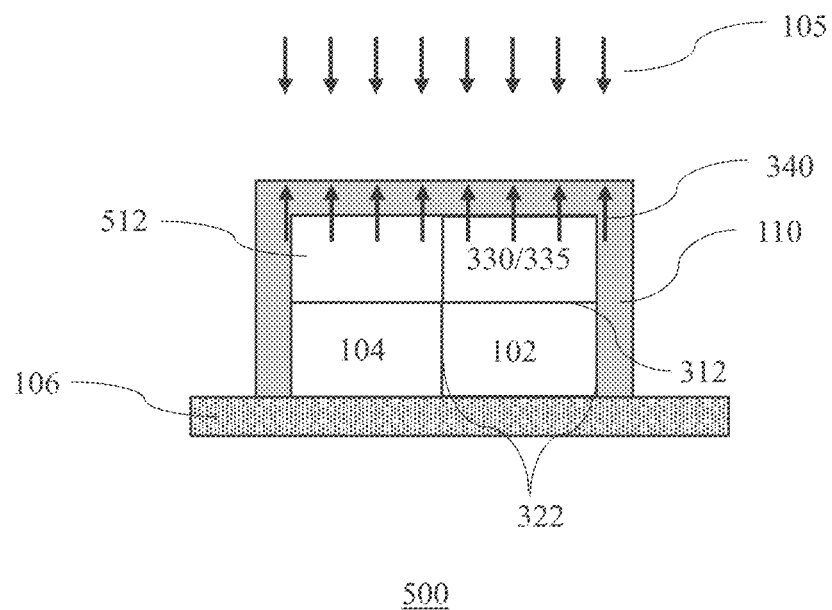
FIGS. 5A-5B show exemplary cross-sectional and schematic views of another embodiment of a memory device.
Figure 5B:
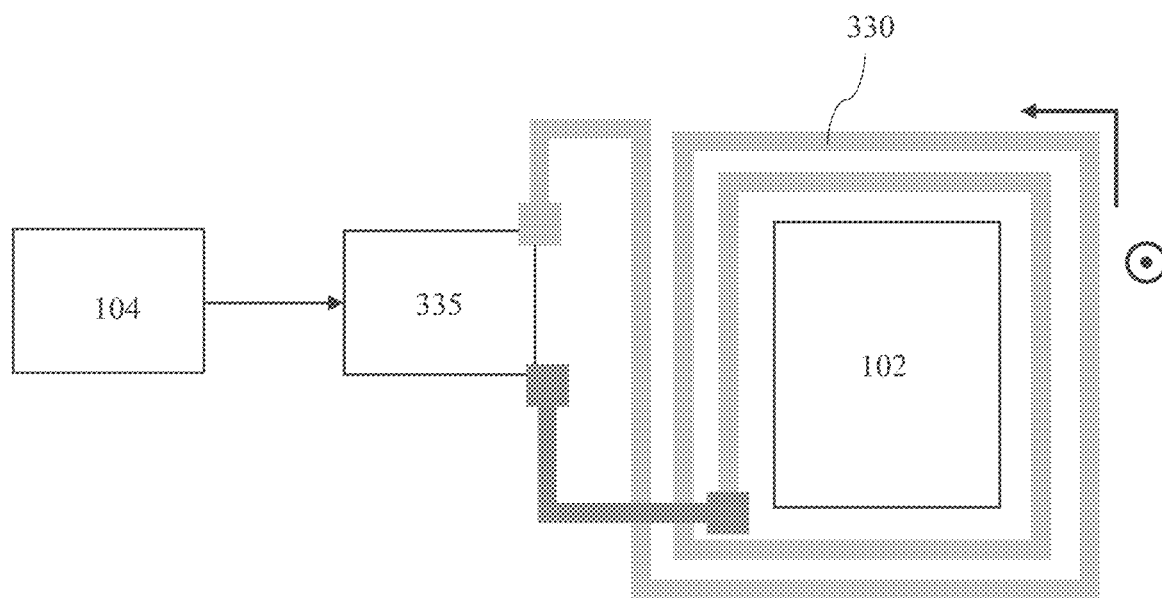

FIGS. 5A-5B show non-limiting cross-sectional and schematic views of another embodiment of a memory device 500. The device 500 is similar to that described in FIGS. 3A-3D. For example, the memory device 400 includes a memory component 102, a sensor component 104, a capping member 110, a coil 330, and a voltage controller 335. In the interest of brevity, common elements or elements having the same reference numerals may not be described or described in detail.

In one embodiment, the capping member 110 may be arranged such that it encapsulates the memory component 102, the sensor component 104, the coil 330, and voltage controller 335. Providing the coil 330 and the sensor component 104 inside the capping member 110 enables the coil 330 to require less power for generating the magnetic field 340 to counter the effect of the external magnetic field 105 because the capping member 110 decreases the effect of the external magnetic field 105 with respect to the memory device 102, even in the absence of the coil 330. Thus, the inclusion of the coil 330 further decreases the effect of the external magnetic field 105 when used in addition to the capping member 110.

In one embodiment, the coil 330 and voltage controller 335 may be arranged over the top surface 312 of the memory component 102. The coil 330 may be formed over the memory component 102 by BEOL metal lines or by external metal wires. The sensor component 104 may be arranged adjacent to a sidewall of the memory component 102. A cavity 512 may be disposed between the capping member 110 and a top surface of the sensor component 104, as illustrated in FIG. 5A. The capping member 110 may cover a top surface of the coil 330 and voltage controller 335, or optionally contact a top surface of the coil 330 and voltage controller 335. FIG. 5B shows a non-limiting schematic view of the operation of memory device 500. Similar to the operation of the memory device 300 as described in FIG. 3B and FIG. 3D, the coil 330 is configured to generate a magnetic field in a direction opposite to the detected external magnetic field.

FIG. 6A shows an exemplary cross-sectional view of yet another embodiment of a memory device 600. The device 600 is similar to that described in FIGS. 3A-3D. For example, the memory device 600 includes a memory component 102, a sensor component 104, and a capping member 110. In the interest of brevity, common elements or elements having the same reference numerals may not be described or described in detail.

The sensor component 104, in one embodiment, may be a two-dimensional (2D) magnetic sensor or a three-dimensional (3D) magnetic sensor. The 2D magnetic sensor may sense the external magnetic field in two dimensions, while the 3D magnetic sensor may sense the external magnetic field in three dimensions. For example, a first dimension may be along the x-axis, a second dimension may be along the y-axis, and a third dimension may be along the z-axis. As an example, the first dimension may be in a vertical direction relative to a top surface of the memory component 102 (e.g., x-axis), the second dimension and the third dimension may be in a horizontal direction relative to the top surface of the memory component 102 (e.g., y-axis and z-axis). The first, second, and third dimensions may be perpendicular to each other. Other configurations for the sensing dimensions may also be useful.

In the case of a 2D magnetic sensor, the sensor component 104 may detect an external magnetic field 105 in a first direction in the first dimension and an external magnetic field 615 in a second direction in the second dimension. In the case of a 3D magnetic sensor, the sensor component 104 may additionally detect an external magnetic field in a third direction in the third dimension (not shown). Providing other types of sensor components for detecting the external magnetic field may also be useful.

The memory device 600 may include a first coil 630 and a first voltage controller 635, and a second coil 640 and a second voltage controller 645. The first coil 630 and the first voltage controller 635 may be arranged over a top surface of the memory component 102, while the second coil 640 and the second voltage controller 645 may be arranged over a sidewall of the memory component 102. Similar to the coil in FIGS. 3A and 3B, the first coil 630 and the second coil 640 are formed over the capping member 110. The first coil 630 and the second coil 640 may be formed of BEOL metal lines or external metal wires.

Figure 6B:
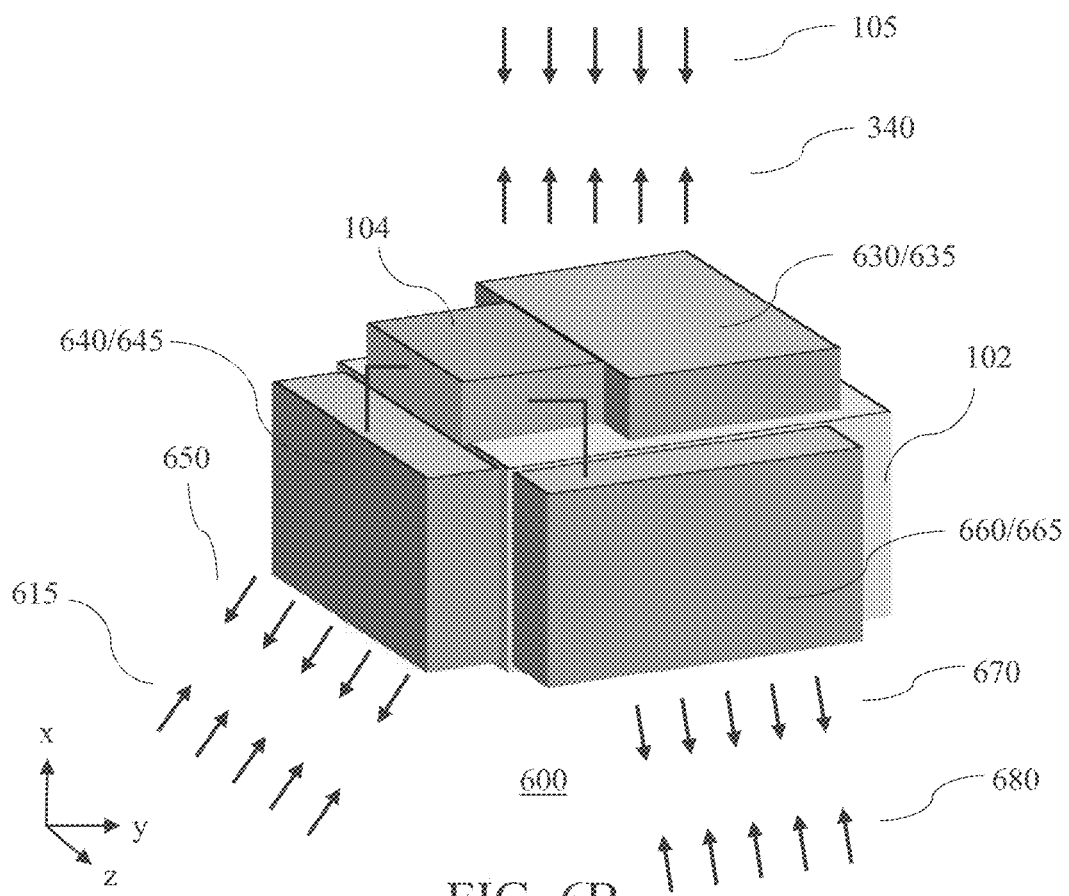
FIG. 6B shows an exemplary perspective view of yet another embodiment of a memory device.

The first coil 630 may be configured to generate a magnetic field 340 in a direction opposite to the first direction of the detected external magnetic field 105 in the first dimension, while the second coil 640 may be configured to generate a magnetic field 650 in a direction opposite to the second direction of the detected external magnetic field 615 in the second dimension. The generated magnetic field 340 reduces or eliminates an impact to the memory component 120 of the detected external magnetic fields. In yet another embodiment, the memory device 600 may include a third coil 660 and a third voltage controller 665, as illustrated in FIG. 6B. The third coil 660 and the third voltage controller 665 may be arranged over a sidewall of the memory component 102. The third coil 660 may be configured to generate a magnetic field 670 in a direction opposite to a third direction of a detected external magnetic field 680 in a third dimension. For example, the third direction of the detected external magnetic field 680 may be towards or away from a sidewall of the memory component, and the generated magnetic field in this case may be away from or towards the sidewall of the memory component (e.g., in a horizontal direction with respect to the top surface of the memory component). Each of the first coil 630 and first voltage controller 635, second coil 640 and second voltage controller 645, third coil 660 and third voltage controller 665 may have similar operating schematics as described with respect to FIG. 3B and FIG. 3D. The generated magnetic field may be in a direction away from or towards a top surface and/or one or more sidewalls of the memory component 102.

The sensor component 104 may be a 3D magnetic sensor. Providing the magnetic memory device with a plurality of coils in different arrangements, such as over the top surface and sidewalls of the memory component 102, advantageously enables generation of magnetic fields in different directions as described to counteract the impact of magnetic fields external to the memory component. Providing a 2D or 3D magnetic sensor and multiple coils facing different directions with the memory component 102 allows the memory device to operate more reliably in environments with complicated external magnetic fields.

Figure 7:
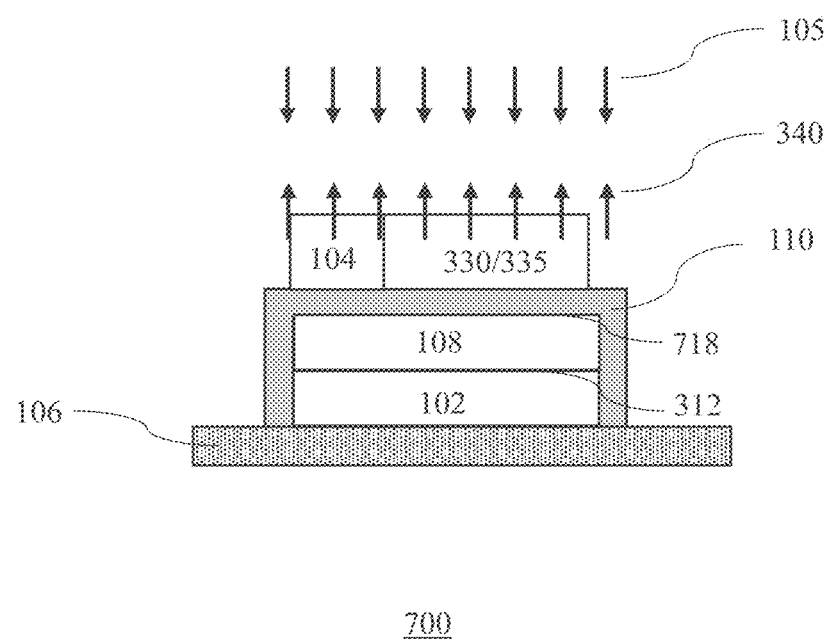
FIG. 7 shows an exemplary cross-sectional view of yet another embodiment of a memory device.

FIG. 7 depicts a non-limiting cross-sectional view of yet another embodiment of a memory device 700. The device 700 is similar to that described in FIGS. 1A-1B and FIGS. 3A-3D. For example, the memory device 700 includes a memory component 102, a sensor component 104, a safety device 108, a coil 330 and a voltage controller 335. Additionally, the memory device 700 may include a capping member 110. In the interest of brevity, common elements or elements having the same reference numerals may not be described or described in detail.

In one embodiment, the safety device 108 may be arranged over a top surface 312 of the memory component 102. Other configurations such as the safety device 108 arranged over a sidewall of the memory component 102 may also be useful. The safety device 108 may be configured to terminate the memory component in response to the signal from the sensor component being above the predetermined threshold value. The safety device provides additional security to the memory device 700. For example, the safety device 108 terminates or disables the memory component 102 in the case of extreme magnetic field such as in the event of a sabotage attempt by a third party. The capping member 110 may encapsulate the memory component 102 and the safety device 108. As illustrated, the capping member 110 covers a top surface 718 of the safety device 108 and sidewalls of the memory component 102 and the safety device 108.

The sensor component 104, for example, may be a 1D sensor. Providing a 2D or 3D sensor may also be useful. In one embodiment, the sensor component 104 and the coil 330 and the voltage controller 335 may be arranged over a top surface 718 of the safety device 108. For example, the sensor component 104 and the coil 330 and the voltage controller 335 are formed on the horizontal portion of the capping member 110. In other cases, the memory device 700 may be provided without a capping member 110. In such cases, the sensor component 104 and the coil 330 and the voltage controller 335 are formed on the top surface 718 of the safety device 108. Other configurations may also be useful. For example, the sensor component 104 and the coil 330 and the voltage controller 335 may be formed adjacent to a sidewall of the sensor component 102. The coil 330 may be formed of BEOL metal line or external metal wires.

Figure 8:
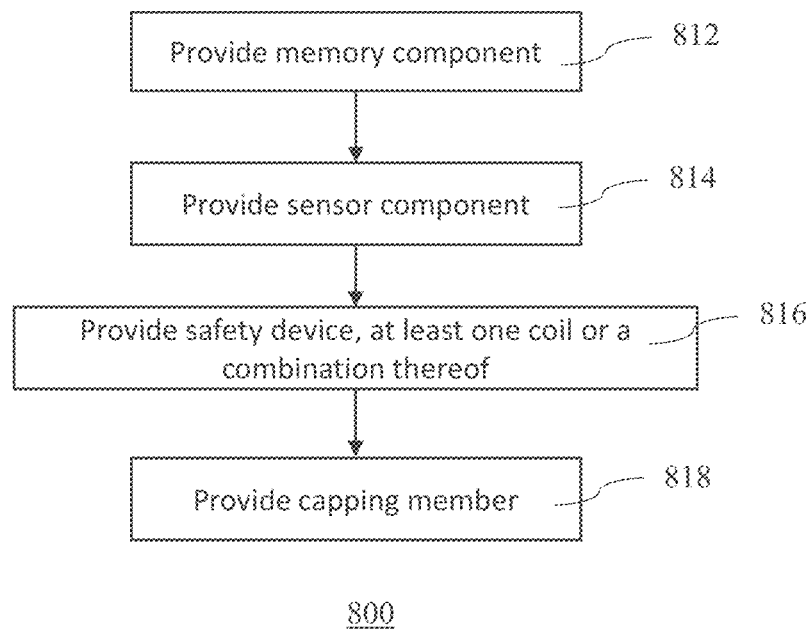
FIG. 8 shows an exemplary block diagram of a method for forming a memory device.

FIG. 8 shows an exemplary block diagram of a method 800 for forming a memory device. The memory device may be a magnetic memory device similar to that described in FIGS. 1A-1B, FIGS. 2A-2B, FIGS. 3A-3D, FIGS. 4A-4B, FIGS. 5A-5B, FIGS. 6A-6B and FIG. 7. At 812, a memory component having a plurality of magnetic storage elements for storing memory data may be provided. At 814, at least one sensor component configured to detect a magnetic field external to the memory component may be provided. The sensor component may output a signal to one or more components of the magnetic memory device based on the detected magnetic field. The memory component may be configured to be terminated when the output signal is above a predetermined threshold value. Additionally, or alternatively, a magnetic field in a second direction opposite to a first direction of the detected magnetic field may be generated, wherein the generated magnetic field reduces or eliminates an impact to the memory component of the detected external magnetic field. At 816, an optional safety device, at least one optional coil, or a combination thereof may be provided. The safety device may be configured to terminate the memory component in response to the signal from the sensor component being above the predetermined threshold. The coil(s) may be configured to generate a magnetic field in a second direction opposite to a first direction of the detected magnetic field. At 818, a capping member may be provided. In some embodiments, the capping member may encapsulate at least the memory component. In some cases, forming the memory device without the capping member may also be useful.

Figure 9:
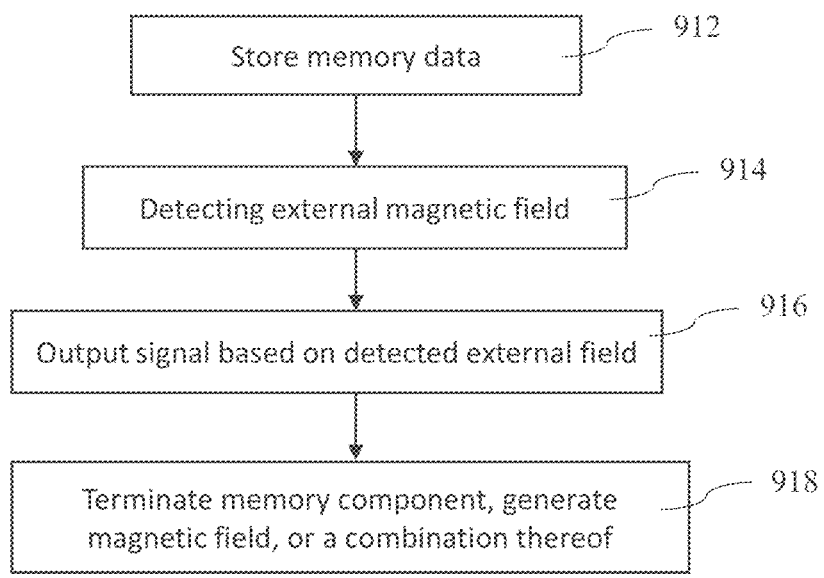
FIG. 9 shows an exemplary block diagram of a method for operating a memory device.

FIG. 9 shows an exemplary block diagram of a method 900 for operating a memory device. The memory device may be a magnetic memory device similar to that described in FIGS. 1A-1B, FIGS. 2A-2B, FIGS. 3A-3D, FIGS. 4A-4B, FIGS. 5A-5B, FIGS. 6A-6B and FIG. 7. At 912, memory data may be stored in a memory component of the magnetic memory device. The memory component includes a plurality of magnetic storage elements. At 914, a magnetic field external to the memory component may be detected by a sensor component of the magnetic memory device. At 916, a signal may be output by the sensor component based on the detected magnetic field. At 918, the memory component may be terminated when the output signal is above the predetermined threshold value, a magnetic field may be generated in a second direction opposite to a first direction of the detected magnetic field, memory data may be transferred by the memory component to an external memory device or a combination thereof. In some embodiments, the output signal from the sensor component may be received by a safety device or directly by the memory component of the magnetic memory device. The memory component may be terminated in response to the signal from the sensor component. In some embodiments, the memory data may be transferred by the memory component to an external memory device prior to the memory component being terminated by the safety device. Additionally, or alternatively, a magnetic field may be generated by a coil of the magnetic memory device in a second direction opposite to a first direction of the detected magnetic field. The generated magnetic field reduces or eliminates an impact to the memory component of the detected external magnetic field.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A magnetic memory device comprising:
   a memory component comprising a plurality of magnetic storage elements for storing memory data;
   at least one sensor component configured to detect a magnetic field external to the memory component, wherein the at least one sensor component outputs a signal to one or more components of the magnetic memory device based on the detected magnetic field; and
   at least one coil configured to generate a magnetic field in a first direction opposite to a second direction of the detected magnetic field when the signal is above a predetermined threshold value.

2. The magnetic memory device of claim 1, wherein the generated magnetic field is configured to reduce or eliminate an impact to the memory component of the detected external magnetic field.

3. The magnetic memory device of claim 1, wherein the at least one sensor component is a one-dimensional (1D) sensor disposed over a sidewall of the memory component, and the at least one coil is disposed over a top surface of the memory component.

4. The magnetic memory device of claim 1, wherein the at least one sensor component is a two-dimensional (2D) sensor disposed over a top surface of the memory component, and the at least one coil further comprises at least two coils, wherein a first coil is disposed over a top surface of the memory component, and a second coil is disposed over a sidewall of the memory component.

5. The magnetic memory device of claim 1, further comprising a capping member encapsulating the memory component.

6. The magnetic memory device of claim 5, wherein the capping member is disposed over a top surface and one or more sidewalls of the memory component, and the at least one coil is disposed over the capping member.

7. The magnetic memory device of claim 6, further comprising a safety device disposed within the capping member, wherein the safety device is configured to terminate the memory component when the signal from the at least one sensor component is above the predetermined threshold value.

8. The magnetic memory device of claim 5, wherein the capping member further encapsulates the at least one sensor component and the at least one coil.

9. The magnetic memory device of claim 1, wherein the at least one coil is disposed over the memory component; and wherein the at least one coil comprises back-end-of line (BEOL) metals.

10. The magnetic memory device of claim 1, wherein the at least one coil comprises external metal wires.

11. The magnetic memory device of claim 1, wherein the memory component is a magnetic random access memory (MRAM) device.

12. A method of forming a device, comprising:
    providing a memory component comprising a plurality of magnetic storage elements for storing memory data;
    providing at least one sensor component configured to detect a magnetic field external to the memory component, wherein the at least one sensor component outputs a signal to one or more components of the magnetic memory device based on the detected magnetic field; and
    providing at least one coil configured to generate a magnetic field in a first direction opposite to a second direction of the detected magnetic field when the signal is above a predetermined threshold value.

13. The method of claim 12, wherein the generated magnetic field is configured to reduce or eliminate an impact to the memory component of the detected external magnetic field.

14. The method of claim 12, wherein the at least one sensor component is a one-dimensional (1D) sensor disposed over a sidewall of the memory component, and the at least one coil is disposed over a top surface of the memory component.

15. The method of claim 12, wherein the at least one sensor component is a two-dimensional (2D) sensor disposed over a top surface of the memory component, and the at least one coil further comprises at least two coils, wherein a first coil is disposed over a top surface of the memory component, and a second coil is disposed over a sidewall of the memory component.

16. The method of claim 12, wherein the at least one coil is formed over the memory component; and wherein the at least one coil comprises back-end-of line (BEOL) metals.

17. The method of claim 12, wherein the at least one coil comprises external metal wires.

18. The method of claim 12, further comprising providing a capping member encapsulating the memory component.

19. A method of operating a magnetic memory device, comprising:

storing memory data in a memory component of the magnetic memory device, wherein the memory component comprises a plurality of magnetic storage elements;

detecting, by at least one sensor component of the magnetic memory device, a magnetic field external to the memory component;

outputting, by the at least one sensor component, a signal to one or more components of the magnetic memory device based on the detected magnetic field; and generating, by at least one coil of the magnetic memory device, a magnetic field in a first direction opposite to a second direction of the detected magnetic field when the signal is above a predetermined threshold value, wherein the generated magnetic field reduces or eliminates an impact to the memory component of the detected external magnetic field.

20. The method of claim 19, wherein the generated magnetic field is configured to reduce or eliminate an impact to the memory component of the detected external magnetic field.

* * * * *